United States Patent
Katoh et al.

(10) Patent No.: US 7,879,262 B2
(45) Date of Patent: Feb. 1, 2011

(54) ALUMINUM PASTE COMPOSITION AND SOLAR CELL ELEMENT USING THE SAME

(75) Inventors: Haruzo Katoh, Osaka (JP); Takashi Watsuji, Osaka (JP)

(73) Assignee: Toyo Aluminum Kabushiki Kaisha, Osaka (JP)

( * ) Notice: Subject to any disclaimer, the term of this patent is extended or adjusted under 35 U.S.C. 154(b) by 228 days.

(21) Appl. No.: 11/990,617

(22) PCT Filed: Sep. 8, 2006

(86) PCT No.: PCT/JP2006/317814

§ 371 (c)(1),
(2), (4) Date: Feb. 19, 2008

(87) PCT Pub. No.: WO2007/046199

PCT Pub. Date: Apr. 26, 2007

(65) Prior Publication Data

US 2009/0250103 A1 Oct. 8, 2009

(30) Foreign Application Priority Data

Oct. 18, 2005 (JP) .............................. 2005-302697

(51) Int. Cl.
*H01B 1/22* (2006.01)
*H01L 31/0224* (2006.01)

(52) U.S. Cl. ...................................... 252/512; 136/256

(58) Field of Classification Search ................. 252/512; 136/252–256
See application file for complete search history.

(56) References Cited

U.S. PATENT DOCUMENTS 3,918,989 A * 11/1975 Gillman et al. ............. 429/206
4,237,606 A * 12/1980 Niwa et al. ..................... 29/830
4,582,657 A * 4/1986 Shibata et al. .............. 264/40.6
5,036,026 A * 7/1991 Yamakawa et al. ......... 501/98.4
7,042,706 B2 * 5/2006 Nagai et al. ................. 361/305
2004/0090721 A1* 5/2004 Nagai et al. .................... 361/15
2004/0245507 A1 12/2004 Nagai et al.

FOREIGN PATENT DOCUMENTS

| EP | 1 400 987 A2 | 3/2004 |
| JP | 5-129640 A | 5/1993 |
| JP | 8-31229 A | 2/1996 |
| JP | 2000-90734 A | 3/2000 |

(Continued)

*Primary Examiner*—Mark Kopec
(74) *Attorney, Agent, or Firm*—Birch Stewart Kolasch & Birch, LLP

(57) ABSTRACT

Provided are an aluminum paste composition capable of inhibiting formation of blisters and globules of aluminum in a back surface electrode layer, which is caused at the time of firing, of reducing bow of a silicon semiconductor substrate even when a thinner silicon semiconductor substrate is used, and of attaining a high BSF effect and a high energy conversion efficiency; and a solar cell element comprising an electrode formed by using the composition. The aluminum paste composition is a paste composition for forming an electrode (8) on a silicon semiconductor substrate (1), comprising: aluminum powder; an organic vehicle; and a plasticizer. The solar cell element comprises the electrode (8) formed by applying on the silicon semiconductor substrate (1) the paste composition having the above-mentioned features and thereafter, firing the paste composition.

6 Claims, 1 Drawing Sheet

FOREIGN PATENT DOCUMENTS

| | | |
|---|---|---|
| JP | 2002-298651 A | 10/2002 |
| JP | 2003-203521 A | 7/2003 |
| JP | 2004-134775 A | 4/2004 |
| JP | 2005-191107 A | 7/2005 |
| JP | 2005-197118 A | 7/2005 |
| JP | 2005-243500 A | 9/2005 |

* cited by examiner

ALUMINUM PASTE COMPOSITION AND SOLAR CELL ELEMENT USING THE SAME

TECHNICAL FILED

The present invention relates generally to aluminum paste compositions and solar cell elements using the same. More particularly, the present invention relates to an aluminum paste composition, which is used when a back surface aluminum electrode is formed on a p-type silicon semiconductor substrate constituting a crystalline silicon solar cell, and to a solar cell element using the same.

BACKGROUND ART

As an electronic component having an electrode formed on a silicon semiconductor substrate, solar cell elements disclosed in Japanese Patent Application Laid-Open Publication No. 2000-90734 (Patent Document 1) and Japanese Patent Application Laid-Open Publication No. 2004-134775 (Patent Document 2) have been known.

FIG. 1 is a schematic view showing a general sectional structure of a solar cell element.

As shown in FIG. 1, the solar cell element is structured by using a p-type silicon semiconductor substrate 1 whose thickness is 220 to 300 μm. On a light receiving surface of the silicon semiconductor substrate 1, an n-type impurity layer 2 whose thickness is 0.3 to 0.6 μm, and an antireflection film 3 and grid electrodes 4, which are on the n-type impurity layer 2, are formed.

On a back surface of the p-type silicon semiconductor substrate 1, an aluminum electrode layer 5 is formed. The formation of the aluminum electrode layer 5 is conducted through applying an aluminum paste composition containing aluminum powder, a glass frit, and an organic vehicle by employing screen printing or the like; drying; and thereafter, firing the aluminum paste composition for a short period of time at a temperature greater than or equal to 660° C. (melting point of aluminum). During the firing, the aluminum is diffused into the p-type silicon semiconductor substrate 1, whereby an Al—Si alloy layer 6 is formed between the aluminum electrode layer 5 and the p-type silicon semiconductor substrate 1 and concurrently, a p+ layer 7 is formed as an impurity layer resulting from diffusion of aluminum atoms. The presence of the p+ layer 7 prevents recombination of electrons, and therefore a BSF (Back Surface Field) effect which enhances a collection efficiency of generated carriers can be obtained.

For example, as disclosed in Japanese Patent Application Laid-Open Publication No. 5-129640 (Patent Document 3), a solar cell element in which a back surface electrode 8 including an aluminum electrode layer 5 and an Al—Si alloy layer 6 is removed by using acid or the like and a collecting electrode layer is newly formed by using a silver paste or the like has been put into practical use. However, since disposal of the acid used for removing the back surface electrode 8 is required, for example, a problem that the disposal makes a process complicated accrues. In recent years, in order to avoid such a problem, many solar cell elements have been structured with the back surface electrode 8 left as it is and utilized as a collecting electrode.

In the meantime, in order to reduce costs in manufacturing solar cells, making a silicon semiconductor substrate thinner has been examined these days. However, when the silicon semiconductor substrate is thinner, after firing the aluminum paste composition, a back surface having a back surface electrode layer formed thereon is deformed in a concave manner due to a difference between thermal expansion coefficients of silicon and aluminum, thereby deforming and bowing the silicon semiconductor substrate. As a method for inhibiting the bow, there is a method in which an applying amount of the aluminum paste composition is decreased and the back surface electrode layer is made thinner. However, when the applying amount of the aluminum paste composition is decreased, blisters and globules of the aluminum are easily formed during the firing. Consequently, a fracture or the like in the silicon semiconductor substrate is caused in a process of manufacturing the solar cells, thereby resulting in a problem that manufacturing yields of the solar cells are reduced.

In order to solve the above-mentioned problems, a variety of aluminum paste compositions have been proposed.

Japanese Patent Application Laid-Open Publication No. 2004-134775 (Patent Document 2) discloses, as an electrically conductive paste which is capable of reducing contraction of an electrode film caused during the firing and of inhibiting bow of an Si wafer, an aluminum paste composition which includes aluminum powder, a glass frit, and an organic vehicle, the organic vehicle containing particles which have low solubility or irresolvability, the particles being at least one kind of organic compound particles and carbon particles.

In addition, Japanese Patent Application Laid-Open Publication No. 2005-191107 (Patent Document 4) discloses a method for manufacturing a solar cell element, which attains a high performance back surface electrode in which formation of globules and protrusions of aluminum and blistering of the electrode are inhibited and achieves high productivity by reducing bow of a semiconductor substrate. In an aluminum paste used in the disclosed method, aluminum powder of which mean particle size $D_{50}$ in cumulative particle size distribution on a volume basis is 6 to 20 μm and in which particles each having a particle size less than or equal to a half of the mean particle size $D_{50}$ account for 15% or less of all particles in the particle size distribution is contained.

However, even when these aluminum pastes were used, it was impossible to sufficiently inhibit formation of blisters and globules of aluminum in the back surface electrode layer, caused during the firing, and, moreover, to sufficiently reduce bow of a semiconductor substrate.

[Patent Document 1] Japanese Patent Application Laid-Open Publication No. 2000-90734

[Patent Document 2] Japanese Patent Application Laid-Open Publication No. 2004-134775

[Patent Document 3] Japanese Patent Application Laid-Open Publication No. 5-129640

[Patent Document 4] Japanese Patent Application Laid-Open Publication No. 2005-191107

DISCLOSURE OF THE INVENTION

Problems to be Solved by the Invention

Therefore, in order to solve the above-mentioned problems, objects of the present invention are to provide an aluminum paste composition capable of inhibiting the formation of blisters and globules of aluminum in a back surface electrode layer, which is caused at the time of firing, of reducing the bow of a silicon semiconductor substrate even when a thinner silicon semiconductor substrate is used, and of attaining a high BSF effect and a high energy conversion efficiency;

and to provide a solar cell element comprising an electrode formed by using the composition.

Means for Solving the Problems

In order to solve the problems of the conventional art, the inventors have devoted themselves to studies. As a result, the inventors found that the above-mentioned objects can be achieved by using an aluminum paste composition having specific composition. Based on the findings, the aluminum paste composition according to the present invention has the following features.

The aluminum paste composition according to the present invention is a paste composition which is used for forming an electrode on a silicon semiconductor substrate and contains aluminum powder, an organic vehicle, and a plasticizer.

It is preferable that the plasticizer contained in the aluminum paste composition of the present invention is one kind selected from the group consisting of phthalate ester based compounds, adipic acid ester based compounds, phosphoric acid ester based compounds, trimellitic acid ester based compounds, citrate ester based compounds, epoxy based compounds, and polyester based compounds.

Further, it is preferable that a content of the plasticizer contained in the aluminum paste composition of the present invention is greater than or equal to 0.05% by mass and less than or equal to 10% by mass.

It is preferable that the aluminum paste composition of the present invention further contains a glass frit.

The solar cell element according to the present invention comprises an electrode which is formed by applying on a silicon semiconductor substrate the aluminum paste composition having any of the above-mentioned features and thereafter, by firing the aluminum paste composition.

EFFECT OF THE INVENTION

As described above, according to the present invention, by using an aluminum paste composition containing a plasticizer, formation of blisters and globules of aluminum in an aluminum electrode layer which is formed on a back surface of a silicon semiconductor substrate can be inhibited; bow of the silicon semiconductor substrate can be reduced even when a thinner silicon semiconductor substrate is used; and yields of manufacturing solar cell elements can be improved.

Furthermore, according to the present invention, by using the aluminum paste composition containing the plasticizer, a high BSF effect and a high energy conversion efficiency can be attained.

EXPLANATION OF REFERENCE NUMERALS

Figure 1:
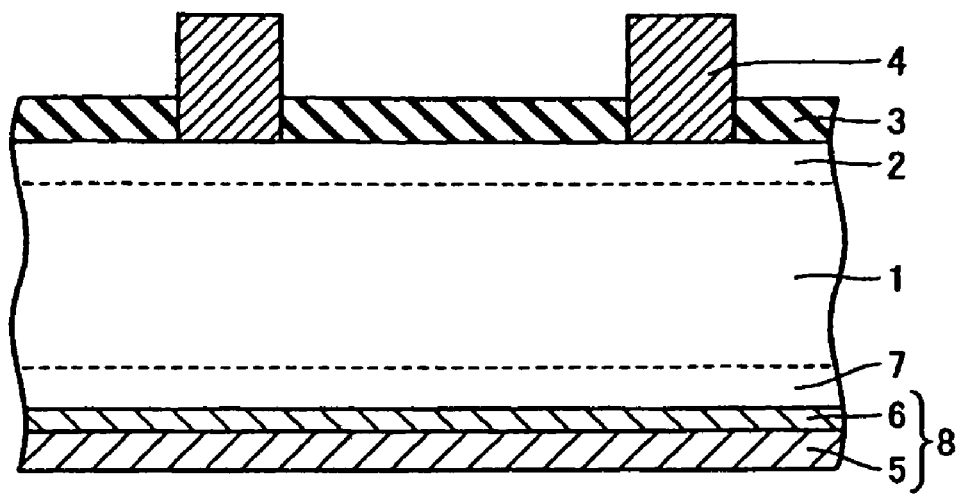
FIG. 1 is a schematic view showing a general sectional structure of a solar cell element to which the present invention is applied as one embodiment.

1: p-type silicon semiconductor substrate, 2: n-type impurity layer, 3: antireflection film, 4: grid electrode, 5: aluminum electrode layer, 6: Al—Si alloy layer, 7: $p^+$ layer, 8: back surface electrode.

BEST MODE FOR CARRYING OUT THE INVENTION

An aluminum paste composition of the present invention contains a plasticizer in addition to aluminum powder and an organic vehicle.

In the present invention, the plasticizer is a substance which is added to provide a material with flexibility or to allow easy processing of the material. The plasticizer is mainly used to soften a plastic whose chief ingredient is vinyl chloride. Most of the plasticizers are chemical compounds (compounds which are generally called as ester) which are synthesized from acid and alcohol.

The plasticizer contained in the aluminum paste composition of the present invention is not particularly limited. As such a plasticizer, in addition to phthalate ester which is highly general-purpose, any of adipic acid ester based compounds, phosphoric acid ester based compounds, trimellitic acid ester based compounds, citrate ester based compounds, epoxy based compounds, polyester based compounds, etc. can be used in a preferable manner.

In particular, phthalate ester such as dimethyl phthalate (DMP), diethyl phthalate (DEP), dibutyl phthalate (DBP), dioctyl phthalate (DOP), di-n-octyl phthalate (DnOP), diisononyl phthalate (DINP), dinonyl phthalate (DNP), diisodecyl phthalate (DIDP), butyl benzyl phthalate (BBP) is used as a plasticizer in a preferable manner.

Two or more kinds of these plasticizers may be blended and used.

It is preferable that a content of the plasticizer contained in the aluminum paste composition of the present invention is greater than or equal to 0.05% by mass and less than or equal to 10% by mass. More preferably, the content of the plasticizer contained in the aluminum paste composition of the present invention is greater than or equal to 0.3% by mass and less than or equal to 7% by mass. If the content of the plasticizer is less than 0.05% by mass, it is impossible to obtain sufficient effects of inhibiting the formation of blisters and globules of aluminum in the back surface electrode layer, which occurs during the firing, and of reducing bow even when a thinner silicon semiconductor substrate is used. If the content of the plasticizer exceeds 10% by mass, it is difficult to attain a high BSF effect and a high energy conversion efficiency.

It is preferable that a content of the aluminum powder contained in the aluminum paste composition of the present invention is greater than or equal to 60% by mass and less than or equal to 80% by mass. If the content of the aluminum powder is less than 60% by mass, a resistance of the aluminum electrode layer formed by the firing is increased, whereby an energy conversion efficiency of solar cells may be reduced. If the content of the aluminum powder exceeds 80% by mass, applying performance of the aluminum paste in screen printing or the like is degraded.

In the present invention, aluminum powder having a wide range of mean particle sizes of 1 to 20 μm can be used. In a case where the aluminum powder is blended in the aluminum paste composition, it is preferable to use aluminum powder having a mean particle size of 2 to 15 μm and more preferable to use aluminum powder having a mean particle size of 3 to 10 μm. If the mean particle size is less than 1 μm, a specific surface area of the aluminum powder is large, which is undesirable. If the mean particle size exceeds 20 μm, an appropriate viscosity of the aluminum paste composition having the aluminum powder contained therein cannot be obtained, which is undesirable. A shape and a manufacturing method of the powder of the aluminum powder contained in the aluminum paste composition of the present invention are not particularly limited.

In an organic vehicle contained in the aluminum paste composition of the present invention, a variety of additives and resins are dissolved into a solvent as necessary.

Heretofore known solvents can be used. Specifically, diethylene glycol monobutyl ether, diethyleneglycol monobutyl ether acetate, dipropylene glycol monomethyl ether, etc. are cited.

As the variety of additives, for example, an antioxidant, a corrosion inhibitor, an antifoaming agent, a viscosity improver, a dispersant, a tackifier, a coupling agent, a static electricity applying agent, a polymerization inhibitor, a thixotropy agent, an anti-settling agent, etc. can be used.

Specifically, for example, a polyethylene glycol ester compound, a polyethylene glycol ether compound, a polyoxyethylene sorbitan ester compound, a sorbitan alkyl ester compound, an aliphatic polyhydric carboxylic acid compound, a phosphoric ester compound, polyester acid amide amine salt, a polyethylene oxide-based compound, a fatty acid amide wax, etc. can be used.

As a resin, heretofore known resins can be used. Two or more kinds of the below-mentioned resins can be combined and used: ethylcellulose, nitrocellulose, polyvinyl butyral, a phenol resin, a melanin resin, a urea resin, a xylene resin, an alkyd resin, an unsaturated polyester resin, an acrylic resin, a polyimide resin, a furan resin, a urethane resin, a isocyanate compound, a thermoset resin such as a cyanate compound, polyethylene, polypropylen, polystyrene, an ABS resin, polymethyl methacrylate, polyvinylchloride, polyvinylidene chloride, polyvinyl acetate, polyvinyl alcohol, polyacetal, polycarbonate, polyethylene terephthalate, polybutylene terephthalate, polyphenylene oxide, polysulfone, polymide, polyether sulfone, polyarylate, polyether ether ketone, polytetrafluoroethylene, a silicon resin, etc. As the organic vehicle contained in the aluminum paste composition of the present invention, organic vehicles which do not dissolve resins are also included.

It is preferable that a content of the organic vehicle is greater than or equal to 10% by mass and less than or equal to 40% by mass. If the content of the organic vehicle is less than 10% by mass or exceeds 40% by mass, printing performance of the paste is degraded.

Furthermore, in order to reinforce bonding of the aluminum electrode layer and the p-type silicon semiconductor substrate, the aluminum paste composition of the present invention may contain a glass frit. It is preferable that a content of the glass frit is less than or equal to 5% by mass. If the content of the glass frit exceeds 5% by mass, segregation of glass may arise. As a glass frit contained in an aluminum paste for forming a back surface electrode of a solar cell, there has been known a glass frit which contains, as a chief ingredient thereof, an oxide such as a $PbO—B_2O_3—SiO_2$ based oxide, a $PbO—B_2O_3—Al_2O_3$ based oxide, a $PbO—B_2O_3—ZnO$ based oxide, a $Bi_2O_3—B_2O_3—SiO_2$ based oxide, a $Bi_2O_3—B_2O_3—ZnO$ based oxide, etc. Although it is most preferable that as the glass frit, lead-free glass which does not adversely affect the environment is used, lead-containing glass may be used.

Although the content of the glass frit contained in the aluminum paste composition of the present invention is not particularly limited, it is preferable that the content of the glass frit is less than or equal to 8% by mass. If the content of the glass frit exceeds 8% by mass, segregation of glass may arise, a resistance of the aluminum electrode layer may be increased, and a power generation efficiency of a solar cell may be reduced. Although a lower limit of the content of the glass frit is not particularly limited, the lower limit of the content of the glass frit in general is greater than or equal to 0.1% by mass. If the lower limit of the content of the glass frit is less than 0.1% by mass, reaction of aluminum and silicon may become insufficient, whereby it is likely that a sufficient BSF effect cannot be attained.

Although a mean particle size of the glass frit contained in the aluminum paste composition of the present invention is not particularly limited, it is preferable that the mean particle size is less than or equal to 20 μm.

EXAMPLES

Hereinunder, one example of the present invention will be described.

First, a variety of aluminum paste compositions which each contain aluminum powder of 60 to 75% by mass, an organic vehicle of 20 to 30% by mass, and a glass frit of 0.3 to 5.0% by mass, and also contain an additive at a percentage shown in Table 1 were prepared.

Specifically, aluminum paste compositions (Examples 1 to 13) were prepared through adding aluminum powder and $B_2O_3—SiO_2—PbO$ based glass frits to organic vehicles having ethyl cellulose dissolved in glycol ether based organic solvents and further adding thereto a variety of plasticizers shown in Table 1 as additives and through blending them by using a well-known mixer. In addition, by employing the same method as described above, conventional aluminum paste compositions (Conventional Examples 1 to 3) which each contain no additive or which do not contain any plasticizer as an additive but each contain other additive were prepared.

Here, in consideration of securing reactivity of the aluminum powder with the p-type silicon semiconductor substrate, applying performance of the aluminum powder, and uniformity of coating films, powder whose particles have mean particle sizes of 2 to 20 μm and have spherical shapes or near-spherical shapes was used.

The above-described variety of aluminum paste compositions were applied and printed on p-type silicon semiconductor substrates each having a thickness of 220 μm and dimensions of 155 mm×155 mm by using a 165-mesh screen printing plate of and were dried. An applying amount was set so as to be 1.5±0.1 g/substrate before drying.

After the p-type silicon semiconductor substrates having the aluminum pastes printed thereon were dried, the p-type silicon semiconductor substrates having the aluminum pastes printed thereon were fired under air atmosphere in an infrared continuous firing furnace. A temperature in a firing zone of the furnace was set to be 760° C. to 780° C. and a time period (firing time) during which the substrates remain in the furnace was set to be 8 to 12 seconds. After the firing, cooling was carried out, whereby a structure in which the aluminum electrode layer 5 and the Al—Si alloy layer 6 were formed in the p-type silicon semiconductor substrate 1 as shown in FIG. 1 was obtained.

In the aluminum electrode layer 5 formed on the silicon semiconductor substrate, the number of blisters and the number of globules of aluminum per measurement surface area 150×150 mm² were visually counted as amounts of formation thereof. A sum of the counted number of blisters and the counted number of globules of aluminum is each shown in Table 1. A target value of a sum thereof, which allows prevention of a fracture in the silicon semiconductor substrate in a manufacturing process, is supposed to be less than or equal to 5.

Figure 2:
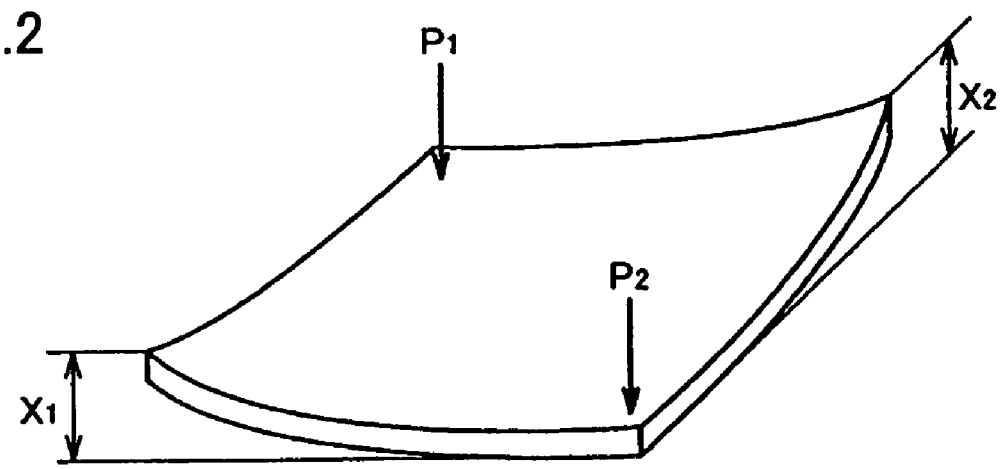
FIG. 2 is a schematic view showing a method for measuring an amount of bow of a p-type silicon semiconductor substrate on which an aluminum electrode layer has been formed by firing.

A bow amount of the p-type silicon semiconductor substrate having the aluminum electrode layer formed thereon by the firing was each evaluated in the below-described manner. As shown in FIG. 2, after the firing and the cooling, two diagonal corners of four corners of the substrate with the aluminum electrode layer being thereon were pressed down as indicated by arrows $P_1$ and $P_2$ and uplift amounts $X_1$ and $X_2$ (each including a thickness of the substrate) of the other corners than the two diagonal corners were measured. An average value of the uplift amounts $X_1$ and $X_2$ is each shown in "Bow [mm]" in Table 1.

A surface resistance of the back surface electrode 8 which influences an ohmic resistance between electrodes was measured by using a 4-point probe surface resistance meter (RG-5-type sheet resistance meter produced by Napson corporation). Measuring conditions were: a voltage was 4 mV; a current was 100 mA, and a load applied on a surface of the back surface electrode 8 was 200 grf (1.96N). A measured value thereof is each shown in "Surface Resistance of Back Surface Electrode [mΩ/□(square)]" in Table 1.

Thereafter, the p-type silicon semiconductor substrate having the back surface electrode 8 formed thereon was immersed in a hydrochloric acid aqueous solution, whereby the aluminum electrode layer 5 and the Al—Si alloy layer 6 were removed through dissolving. A surface resistance of the p-type silicon semiconductor substrate having a $p^+$ layer 7 formed thereon was each measured by using the above-mentioned surface resistance meter. A measured value thereof is each shown in "Surface Resistance of $p^+$ Layer [Ω/□(square)]" in Table 1.

It is assumed that there is a correlation between a surface resistance of the $p^+$ layer 7 and a BSF effect and the smaller the surface resistance thereof is, the higher the BSF effect is. Here, a target value of the surface resistance is less than or equal to 18 mΩ/□(square) in the back surface electrode 8 and less than or equal to 16Ω/□(square) in the $p^+$ layer 7.

The described embodiment and examples are to be considered in all respects only as illustrative and not restrictive. It is intended that the scope of the invention is, therefore, indicated by the appended claims rather than the foregoing description of the embodiment and examples and that all modifications and variations coming within the meaning and equivalency range of the appended claims are embraced within their scope.

INDUSTRIAL APPLICABILITY

According to the present invention, by using an aluminum paste composition containing a plasticizer, formation of blisters and globules of aluminum in an aluminum electrode layer which is formed on a back surface of a silicon semiconductor substrate can be inhibited; bow of the silicon semiconductor substrate can be reduced even when a thinner silicon semiconductor substrate is used; and yields of manufacturing solar cell elements can be improved.

The invention claimed is:

1. An aluminum paste composition for forming an electrode on a silicon semiconductor substrate comprising: aluminum powder; an organic vehicle; 3.0 to 10.5% by mass of a phthalate ester based plasticizer; and a glass frit.

2. The aluminum paste composition of claim 1, which contains 60 to 80% by mass of said aluminum powder.

3. A solar cell element comprising an electrode (8) formed by applying the aluminum paste composition according to claim 1 on a silicon semiconductor substrate (1) and thereafter, firing the aluminum paste composition.

TABLE 1

|  |  | Additive | Added Amount [% by mass] | Surface Resistance of Back Surface Electrode [mΩ/□] | Surface Resistance of $p^+$ Layer [Ω/□] | Amount of Forming Al Globules and Blisters [piece(s)] | Bow [mm] |
|---|---|---|---|---|---|---|---|
| Conventional Example | 1 | — | 0 | 11.1 | 11.5 | 10 | 2.50 |
|  | 2 | Polyethylene Particles (3 μm) | 5 | 13.8 | 11.1 | 11 | 2.41 |
|  | 3 | Carbon Particles (5 μm) | 3 | 11.9 | 12.6 | 8 | 2.29 |
| Example | 1 | DOP | 0.04 | 13.2 | 11.1 | 5 | 2.18 |
|  | 2 | DOP | 0.07 | 10.9 | 10.7 | 2 | 1.90 |
|  | 3 | DOP | 3.0 | 11.1 | 10.4 | 0 | 1.64 |
|  | 4 | DOP | 8.0 | 12.7 | 11.9 | 0 | 1.59 |
|  | 5 | DBP | 0.1 | 11.2 | 11.2 | 1 | 1.95 |
|  | 6 | DBP | 4.0 | 11.3 | 10.6 | 0 | 1.84 |
|  | 7 | DBP | 7.0 | 13.6 | 13.3 | 0 | 1.65 |
|  | 8 | DBP | 9.0 | 14.6 | 13.2 | 0 | 1.71 |
|  | 9 | DBP | 10.5 | 17.3 | 15.6 | 0 | 1.54 |
|  | 10 | DINP | 0.07 | 11.5 | 11.1 | 2 | 1.93 |
|  | 11 | DINP | 3.0 | 10.8 | 11.7 | 0 | 1.66 |
|  | 12 | DINP | 8.0 | 14.0 | 13.1 | 0 | 1.49 |
|  | 13 | DOP + DBP | 2 + 2 | 11.1 | 11.5 | 0 | 1.63 |

It is found from a result shown in Table 1 that by using the aluminum paste compositions (Examples 1 to 13) of the present invention, which each contain the plasticizer, a reduction in an electrode function and an BSF effect of the aluminum electrode layer can be avoided, the bow can be reduced, and formation of the blisters and the globules of aluminum in the aluminum electrode layer can be inhibited, when compared with the conventional aluminum paste compositions (Conventional Examples 1 to 3) which each contain no plasticizer.

4. An aluminum paste composition for forming an electrode on a silicon semiconductor substrate which consists essentially of: 60 to 80% by mass of an aluminum powder; an 10 to 40% by mass of organic vehicle; 3.0 to 10.5% by mass of a phthalate ester based plasticizer; and a glass frit.

5. The aluminum paste composition of claim 4, wherein the aluminum powder has a mean particle size of 1 to 20 μm.

6. The aluminum paste composition of claim 4, which contains 0.1 to 5% by mass of glass frit.

* * * * *